United States Patent
Lee et al.

(10) Patent No.: US 7,604,907 B2
(45) Date of Patent: Oct. 20, 2009

(54) MULTI-EXPOSURE SEMICONDUCTOR FABRICATION MASK SETS AND METHODS OF FABRICATING SUCH MULTI-EXPOSURE MASK SETS

(75) Inventors: Doo-Youl Lee, Seoul (KR); Seok-Hwan Oh, Gyeonggi-do (KR); Gi-Sung Yeo, Seoul (KR); Sang-Gyun Woo, Gyeonggi-do (KR); Sook Lee, Seoul (KR); Joo-On Park, Gyeonggi-do (KR); Sung-Gon Jung, Seoul (KR)

(73) Assignee: Samsung Electronics Co., Ltd. (KR)

( * ) Notice: Subject to any disclaimer, the term of this patent is extended or adjusted under 35 U.S.C. 154(b) by 562 days.

(21) Appl. No.: 11/243,401

(22) Filed: Oct. 4, 2005

(65) Prior Publication Data

US 2006/0073396 A1 Apr. 6, 2006

(30) Foreign Application Priority Data

Oct. 5, 2004 (KR) .................. 10-2004-0079042

(51) Int. Cl.
*G03F 1/00* (2006.01)
(52) U.S. Cl. .................. 430/5; 430/394; 430/22
(58) Field of Classification Search .................. 430/5, 430/22, 394
See application file for complete search history.

(56) References Cited

U.S. PATENT DOCUMENTS

| | | | |
|---|---|---|---|
| 6,316,163 B1 | 11/2001 | Magoshi et al. | |
| 6,566,019 B2 * | 5/2003 | Kling et al. | 430/5 |
| 6,632,592 B1 | 10/2003 | Mimotogi | |
| 6,656,663 B2 | 12/2003 | Fujiwara | 430/296 |
| 6,660,438 B2 * | 12/2003 | Tanaka et al. | 430/22 |
| 6,753,116 B2 * | 6/2004 | Cauchi | 430/5 |
| 2002/0187440 A1 | 12/2002 | Kochi et al. | |
| 2003/0027366 A1 | 2/2003 | Dulman et al. | |
| 2004/0043305 A1 | 3/2004 | Park et al. | 430/5 |
| 2004/0074868 A1 | 4/2004 | Chang | |
| 2004/0086789 A1 * | 5/2004 | Hasegawa et al. | 430/5 |

(Continued)

FOREIGN PATENT DOCUMENTS

DE      100 06 952 C2      5/2002

(Continued)

OTHER PUBLICATIONS

Literal Translation of the relevant parts of the Office Action for German Patent Application No. 10-2005-047 475.6-51; Date of mailing Jan. 31, 2007.

(Continued)

*Primary Examiner*—Mark F Huff
*Assistant Examiner*—Stewart A Fraser
(74) *Attorney, Agent, or Firm*—Myers Bigel Sibley & Sajovec (57) ABSTRACT

Mask sets are provided which may be used to define a first pattern region that has a first pitch pattern and a second pattern region that has a second pitch pattern during the fabrication of a semiconductor device. These mask sets may include a first mask that has a first exposure region in which a first halftone pattern defines the first pattern region and a first screen region in which a first shield layer covers the second pattern region. These mask sets may further include a second mask that has a second exposure region in which a second halftone pattern defines the second pattern region and a second screen region in which a second shield layer covers the first pattern region. The second shield layer also extends from the second screen region to cover a portion of the second halftone pattern.

21 Claims, 11 Drawing Sheets

U.S. PATENT DOCUMENTS

2004/0170906 A1  9/2004  Chen et al.

FOREIGN PATENT DOCUMENTS

| JP | 2001-308004 | 11/2001 |
| JP | 2004-086125 | 3/2004 |
| KR | 2002-0046489 | 6/2002 |
| KR | 1020030043443 | 6/2003 |
| KR | 2003-0056019 | 7/2003 |
| KR | 1020040019601 | 6/2004 |

OTHER PUBLICATIONS

Notice to Submit a Response for Korean Patent Application No. 10-2004-79042 mailed on Feb. 22, 2006.

English Translation of Taiwanese Office Action (7 pages) corresponding to ROC (Taiwan) Patent Application No. 094134812; Issue Date: Feb. 9, 2009.

* cited by examiner

Fig. 10C

MULTI-EXPOSURE SEMICONDUCTOR FABRICATION MASK SETS AND METHODS OF FABRICATING SUCH MULTI-EXPOSURE MASK SETS

CLAIM OF PRIORITY

This application claims priority under 35 U.S.C. § 119 from Korean Patent Application No. 2004-79042, filed on Oct. 5, 2004, the contents of which is hereby incorporated by reference herein as if set forth in its entirety.

FIELD OF THE INVENTION

This disclosure generally relates to semiconductor devices and, more specifically, to mask sets that may be used in fabricating semiconductor devices and methods of fabricating such mask sets.

BACKGROUND OF THE INVENTION

Semiconductor memory devices generally include a cell array region and a peripheral circuit region. The cell array region is formed by repeatedly applying the same pattern to the device, whereas a number of different patterns may be applied in the peripheral circuit region. Typically, the level of integration achieved in the cell array region is the primary factor determining the overall level of integration of the semiconductor memory device. The level of integration achieved may depend on, among other things, the minimum resolution of the process used, the depth-of-focus (DOF), and/or the exposure latitude (EL). In recent years, off-axis illumination (OAI) techniques have been introduced, which can facilitate ensuring that a minimum resolution is obtained even as the line-width of patterns is decreased. Off-axis illumination (OAI) techniques generally can provide excellent resolution and DOF and, consequently, can be used to form small pitch patterns. However, OAI techniques can have drawbacks in terms of exposure condition with respect to size, shape, and direction of patterns. As such, conventional illuminations that employ annular apertures may be used to transfer various patterns. However, the patterns provided may not be ideal depending on the shape and geometry of the patterns required. Double-exposure techniques may be used to provide improved patterns. In double-exposure techniques, a primary exposure is performed with respect to a first pattern region, and then a secondary exposure is performed with respect to a second pattern region.

Figure 1:
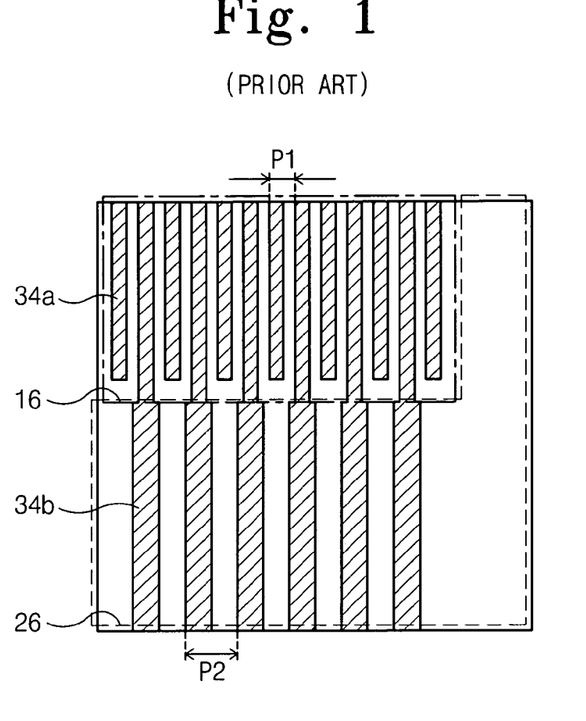
FIG. 1 is a plan view of a portion of a conventional semiconductor device that has a pattern region with two different pitches.

FIG. 1 is a plan view of part of a conventional semiconductor memory device having a pattern region that includes patterns of two different pitches.

Many conventional semiconductor devices include a pattern region that has patterns that have two or more different pitches. By way of example, in conventional semiconductor memory devices, the cell array region may have a pattern that has a first pitch and the peripheral circuit region may include one or more patterns that have different pitches. In order to maximize the integration of the device, the memory cells in the cell array region typically have the minimum line width. In contrast, a relatively larger pitch pattern may be provided in the peripheral circuit region. For example, as shown in FIG. 1, the pattern region of the semiconductor memory device may include a first pattern 34a having a first pitch P1 and a second pattern 34b that has a second pitch P2. The second pitch P2 is larger than the first pitch P1. By dividing the semiconductor device into regions and using a double-exposure process that applies exposure conditions that may be optimized for each region, it may be possible to obtain improved patterns. For the first (primary) exposure, a region 16 in which a first pattern is formed is exposed in order to transfer the first pattern. For the second exposure, a region 26 in which a second pattern is formed is exposed in order to transfer the second pattern 34b.

Figure 2A:
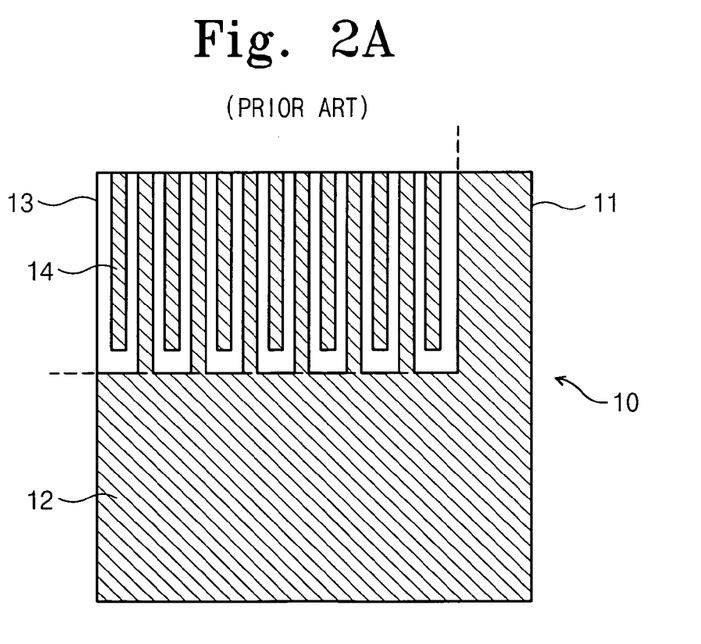
FIGS. 2A and 2B are plan views of a conventional double-exposure mask set.
Figure 2B:
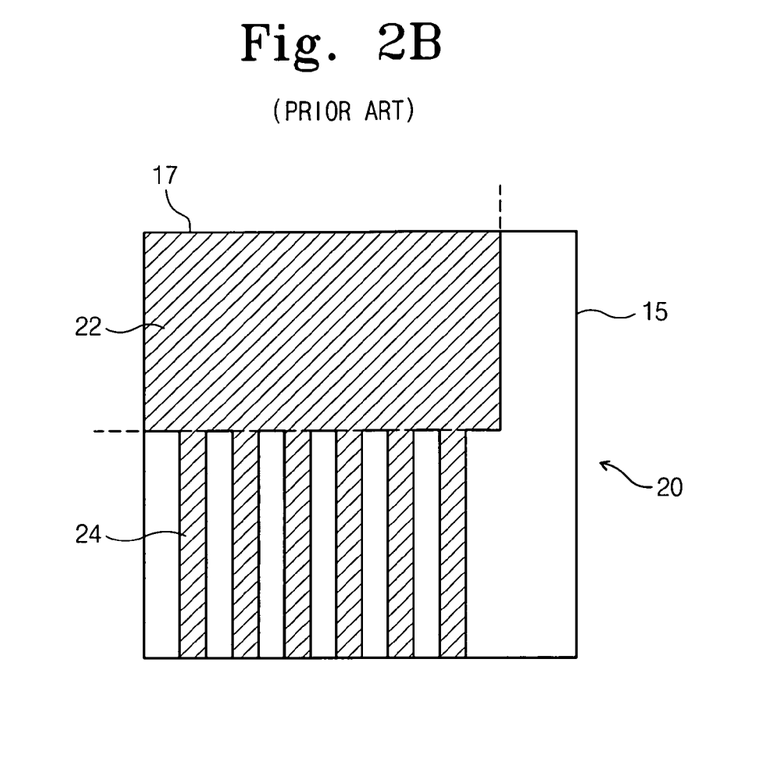

FIGS. 2A and 2B are plan views of the first mask layer 10 and the second mask layer 20, respectively, of a conventional double-exposure mask set. First mask layer 10 may be used to form the first pattern 34a depicted in FIG. 1. Second mask layer 20 may be used to form the second pattern 34b of FIG. 1. As shown by the dotted line in FIG. 2A, the first mask layer 10 includes a first screen region 11 and a first exposure region 13. The first screen region 11 is covered with a shield layer 12, whereas a first pattern 14 is formed in the first exposure region 13. As shown in FIG. 2b, the second mask layer 20 includes a second screen region 17 and a second exposure region 15. The second screen region 17 is covered with a shield layer 22, whereas a second pattern 24 is formed in the second exposure region 15. The first and second mask layers 10, 20 may be used to pattern a substrate using a double-exposure process.

Misalignment of the first and second exposures may occur in a double-exposure process. As such, the first and second mask layers 10, 20 may be formed such that the first and second exposure regions 13, 15 overlap. The overlap region forms a desired pattern by performing Optical Proximity Correction (OPC) considering the double-exposure. However, a halftone mask with high contrast may provide a poor pattern in the overlap region due to misalignment and registration at the exposure boundaries.

FIGS. 3A to 3D are plan views illustrating how misalignment and registration can impact the patterns formed using a conventional double-exposure mask set.

Figure 3A:
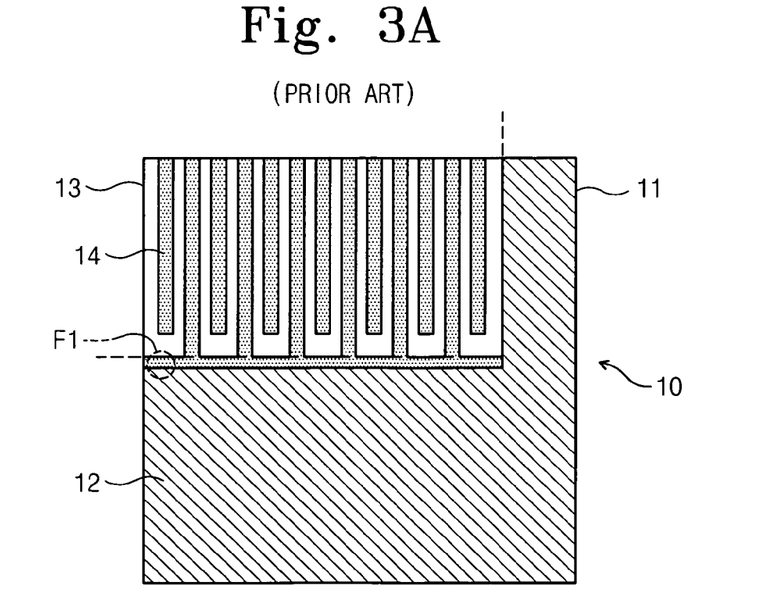
FIGS. 3A to 3D are plan views illustrating how misalignment and registration can impact the patterns formed using a conventional double-exposure mask set.
Figure 3B:
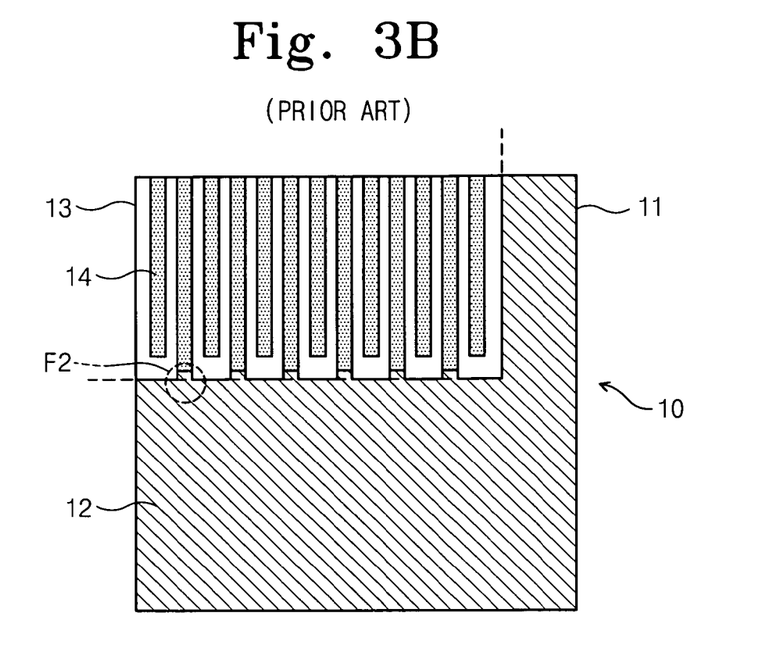
Figure 3C:
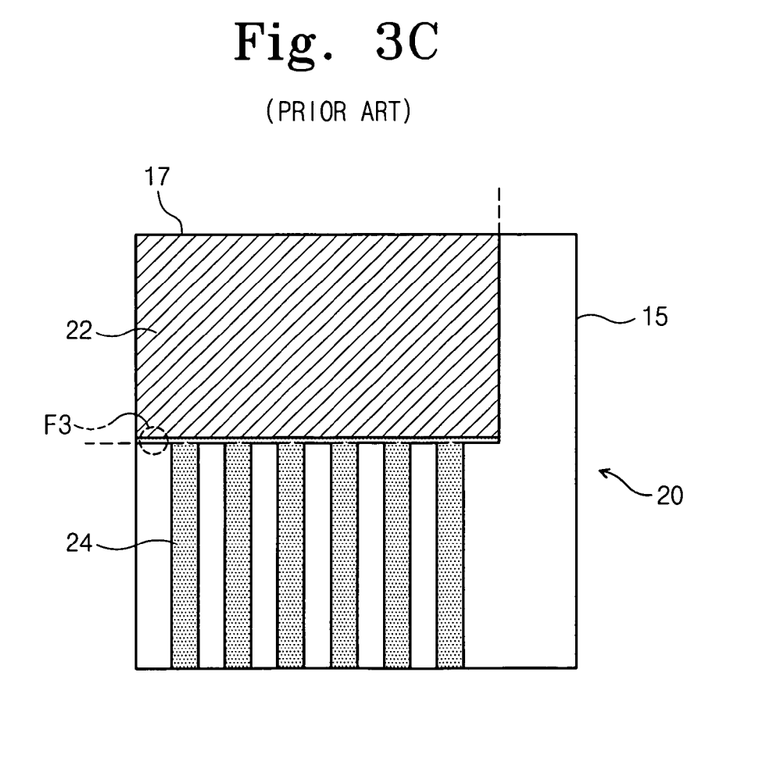
Figure 3D:
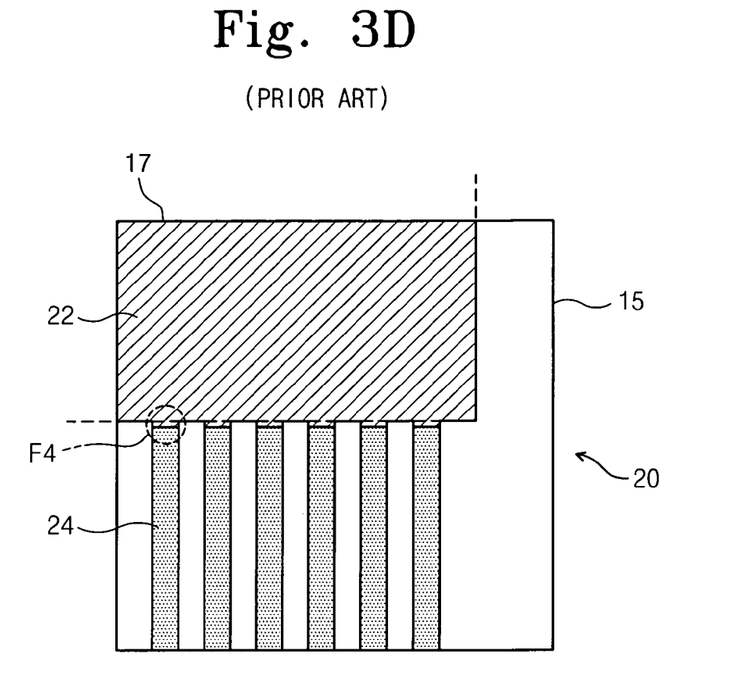

As shown in FIG. 3A, if misalignment and registration occur, the shield layer 12 may fail to completely cover halftone pattern 14 at a boundary of the first exposure region 13 of the first mask layer 10 (see, e.g., the region labeled F1 in FIG. 3A). Likewise, as shown in FIG. 3C, as a result of misalignment and registration the shield layer 22 may fail to completely cover halftone pattern 24 at a boundary of the second exposure region 15 of the second mask layer 20 (see, e.g., the region labeled F2 in FIG. 3B). Alternatively (or additionally), as shown in FIG. 3B, a part of the shield layer 12 may extend into the first exposure region 13 of the first mask layer 10, thereby covering a portion of the halftone pattern 14 at a boundary of the first exposure region 13 (see, e.g., the region labeled F3 in FIG. 3C). Likewise, as shown in FIG. 3D, the shield layer 22 may extend into the second exposure region 15 of the second mask layer 20, thereby covering a portion of the halftone pattern 24 at a boundary of the second exposure region 15 (see, e.g., the region labeled F4 in FIG. 3D). First and second mask layers become OPC considering the double-exposure of the overlap region. The imperfect patterns in the regions labeled F1, F2, F3 and F4 at the boundaries of the exposure regions may prevent proper exposure or induce unwanted double-exposure.

SUMMARY OF THE INVENTION

Pursuant to embodiments of the present invention, mask sets are provided which may provide improved patterns at the boundaries of first and second exposure regions during a double (or multi) exposure process, as well as methods of fabricating such mask sets.

According to certain embodiments of the present invention, mask sets are provided that include a first mask layer that has a first shield region and a first exposure region in which a first halftone pattern is formed to define the first pattern region and a second mask layer that has a second exposure region in which a binary pattern and a second halftone pattern are formed to define a second pattern region. In these mask sets, the first halftone pattern may have a first pitch and the second halftone pattern may have a second pitch that is larger than the first pitch. The binary pattern may define a portion of the second pattern region that is adjacent to the first pattern region, and the binary pattern may connect to the first halftone pattern. Additionally, a part of the second exposure region may overlap a part of the first exposure region. In such embodiments, the binary pattern may be provided in the portion of the second exposure region that overlaps the first exposure region and in a portion of the second pattern region that is adjacent to the portion of the second exposure region that overlaps the first exposure region.

Pursuant to further embodiments of the present invention, mask sets are provided which may be used to define a first pattern region that has a first pitch pattern and a second pattern region that has a second pitch pattern during the fabrication of a semiconductor device. These mask sets include a first mask that has a first exposure region in which a first halftone pattern defines the first pattern region and a first screen region in which a first shield layer covers the second pattern region. These mask sets further include a second mask that has a second exposure region in which a second halftone pattern defines the second pattern region and a second screen region in which a second shield layer covers the first pattern region. The second shield layer also extends from the second screen region to cover a portion of the second halftone pattern.

In specific embodiments of these mask sets, the first exposure region and the second exposure region may overlap to define an overlap region. In such embodiments, the width of the overlap region may be less than a predetermined width, and/or the portion of the second halftone pattern covered by the second shield layer may be more than twice the area of the overlap region. The second pitch may be larger than the first pitch. Additionally, the first halftone pattern may define a pattern which is repeated periodically while the second halftone pattern may define an irregular pattern.

Pursuant to still further embodiments of the present invention, mask sets for defining a cell array region and a peripheral circuit region during the fabrication of a semiconductor memory device are provided which comprise (1) a first mask layer that includes (a) a first halftone pattern that defines the cell array region and (b) a first shield layer that covers the peripheral circuit region and (2) a second mask layer that includes (a) a second halftone pattern that defines the peripheral region and (b) a second shield layer that covers the cell array region and a portion of the second halftone pattern.

In specific embodiments of these mask sets, the first halftone pattern may be positioned in a first exposure region and the second halftone pattern may be positioned in a second exposure region. The first exposure region and the second exposure region may also overlap to define an overlap region. The portion of the second halftone pattern covered by the second shield layer may be more than twice the area of the overlap region. Moreover, a predetermined portion of the first halftone pattern may not overlap with the second halftone pattern in the overlap region. The first exposure region may extend into a portion of the peripheral circuit region that is adjacent to the cell array region.

Pursuant to still further embodiments of the present invention, method of fabricating a mask set that defines a pattern that includes a first pattern region and a second pattern region are provided. Pursuant to these methods, a first halftone layer is formed on a first mask substrate. A first shield layer is formed on the first halftone layer. The first halftone layer and the first shield layer are patterned to form a first mask layer, where the first mask layer includes a first exposure region where the first pattern region is defined and a first screen region that covers the second pattern region. A second halftone layer is formed on a second mask substrate. A second shield layer is formed on the second halftone layer. The second halftone layer and the second shield layer are patterned to form a second mask layer, where the second mask layer includes a second exposure region where the second pattern region is defined and a second screen region that covers the first pattern region. The first shield layer is removed in the first exposure region. Finally, the second shield layer is removed in only a portion of the second exposure region so that the second shield layer extends from the second screen region into a portion of the second exposure region.

In these methods, the first exposure region and the second exposure region may partially overlap to define an overlap region. The portion of the second exposure region that includes the second shield layer may have an area that is at least twice an area of the overlap region. Also, the first pattern region may have a first pitch pattern and the second pattern region may have a second pitch pattern that is larger than the first pitch pattern.

BRIEF DESCRIPTION OF THE DRAWINGS

The accompanying drawings, which are included to provide a further understanding of the invention and are incorporated in and constitute a part of this application, illustrate certain embodiment(s) of the invention. In the drawings.

DETAILED DESCRIPTION

Embodiments of the present invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present invention. As used herein, the term "and/or" includes any and all combinations of one or more of the associated listed items.

It will be understood that when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Other words used to describe the relationship between elements should be interpreted in a like fashion (i.e., "between" versus "directly between", "adjacent" versus "directly adjacent", etc.).

Relative terms such as "below" or "above" or "upper" or "lower" or "horizontal" or "vertical" may be used herein to describe a relationship of one element, layer or region to another element, layer or region as illustrated in the figures. It will be understood that these terms are intended to encompass different orientations of the device in addition to the orientation depicted in the figures.

Embodiments of the invention are described herein with reference to cross-section illustrations that are schematic illustrations of idealized embodiments (and intermediate structures) of the invention. The thickness of layers and regions in the drawings may be exaggerated for clarity. Additionally, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" "comprising," "includes" and/or "including" when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 4A:
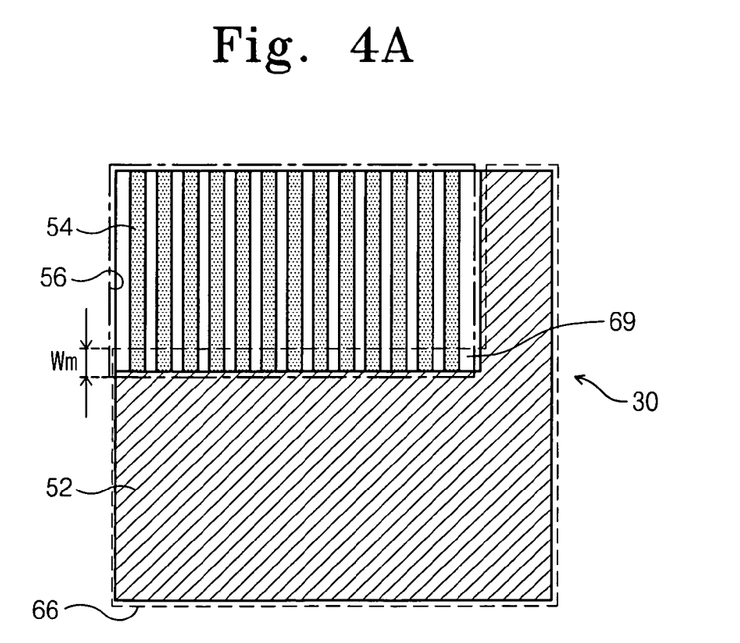
FIGS. 4A and 4B are plan views of a double-exposure mask set according to certain embodiments of the present invention.
Figure 4B:
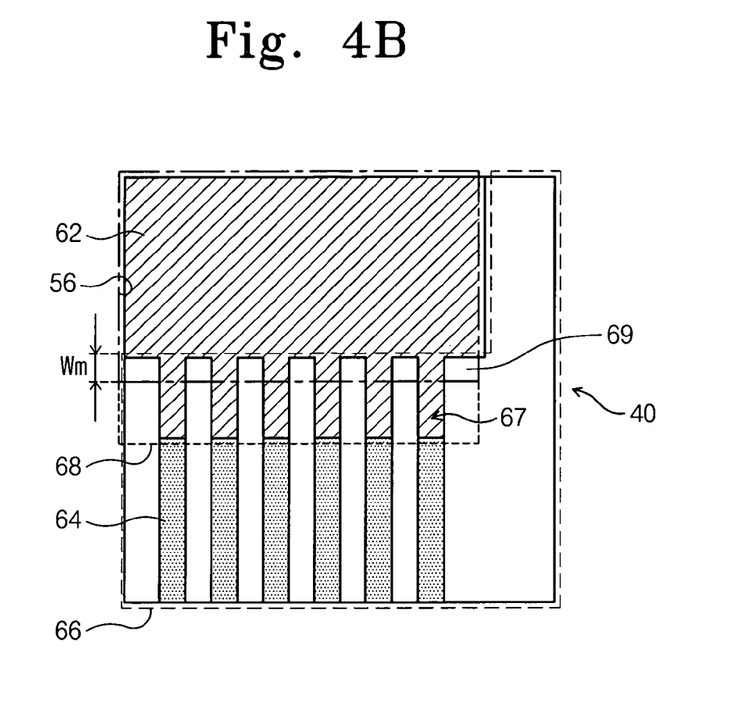

FIGS. 4A and 4B are plan views of a double-exposure mask set according to certain embodiments of the present invention. FIG. 4A is a plan view of a first mask layer 30 that is used in the first exposure of the double-exposure, and FIG. 4B is a plan view of a second mask layer 40 that is used in the second exposure of the double-exposure. As shown in FIG. 4A, the first mask layer 30 includes a first exposure region 56 that defines a first pattern region, and a first screen region that comprises a shield layer 52 that prevents exposure of a second pattern region. As shown in FIG. 4B, the second mask layer 40 includes a second exposure region 66 that defines a second pattern region, and a second screen region that comprises a shield layer 62 that covers the first pattern region 56. In order to provide for possible misalignment of either or both the first and second mask layers 30, 40, the first and second exposure regions 56 and 66 can be designed to be overlap with each other by as much as a width Wm. Thus, second exposure region 66 comprises the first screen region (shield layer 52) plus the overlap region 69, and the first exposure region 56 comprises the second screen region (shield layer 62) plus the overlap region 69. The overlap region 69 may be provided at portions of the substrate that are influenced by a misalignment of the primary and secondary exposures. For example, boundaries of patterns receiving the primary and secondary exposures may be designed to overlap. Due to double-exposure of the overlap region, it may become Optical Proximity Correction (OPC).

As shown in FIG. 4A, a first halftone pattern 54 may be formed in the first exposure region 56 of the first mask layer 30. Then, as shown in FIG. 4B, a binary pattern 67 and a second halftone pattern 64 may be formed in the second exposure region 66 of the second mask layer 40. The binary pattern 67 is formed in a binary region 68. A shield layer 62 covers the second screen region and also extends from the second screen region onto the second halftone pattern 64 to form the binary pattern 67. As a result, the binary pattern 67 is formed in the overlap region 69 and in the binary region 68 to define a portion of the second pattern region that is adjacent to the first pattern region. As shown in FIGS. 4A and 4B, the binary region 68 is wider than the overlap region 69. The binary pattern 67 may define a pattern that connects to the first halftone pattern 54.

As shown in FIG. 4B, the boundary between the binary pattern 67 and the second halftone pattern 64 is offset from the overlap region 69. Accordingly, even if misalignment or registration of the second halftone pattern 64 and the shield layer 62 occurs, lower quality pattern regions such as regions F3 or F4 of FIGS. 3C and 3D can be avoided. Moreover, even if misalignment or registration of a shield layer and a halftone layer occurs at the overlap region 69 of the first mask layer, there may be reduced misalignment or registration at the overlap region 69 of the second mask layer. As a result, a poor pattern at primary exposure can be reduced or corrected by the secondary exposure.

A pattern with a non-uniform line-width may be formed at or adjacent the boundary between the binary pattern 67 and the second halftone pattern 64. However, as the second pattern region typically has a high process margin, such a non-uniform line width typically may not degrade the performance of the device. Moreover, any such non-uniform line-width may be addressed by applying OPC at the boundary between the binary pattern 67 and the halftone pattern 64.

In embodiments of the present invention, the first mask layer 30 may define the cell array region of the semiconductor memory device, and the second mask layer 40 may define the peripheral circuit region of the semiconductor memory device.

Figure 5:
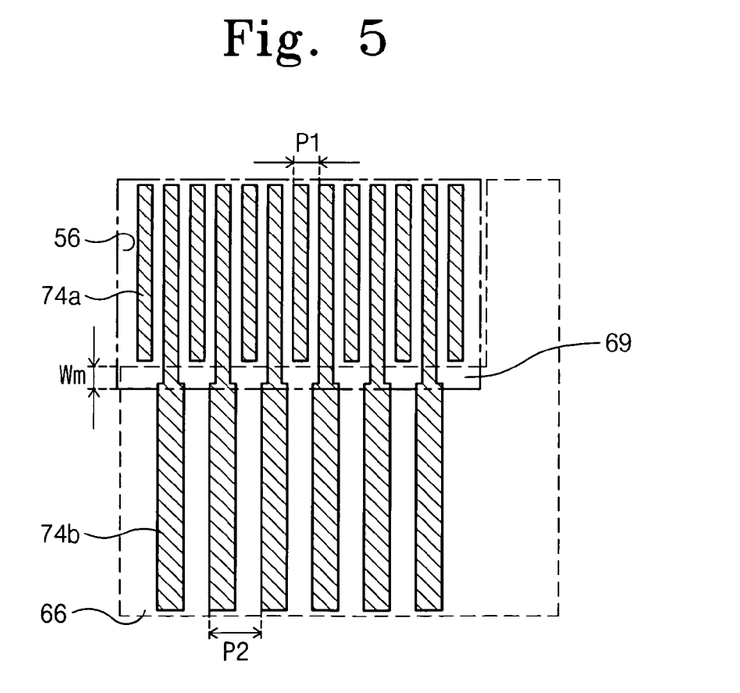
FIG. 5 is a plan view of a resist pattern formed using the double-exposure mask set of FIGS. 4A and 4B.

FIG. 5 is a plan view of a resist pattern that may be formed using the double-exposure mask set depicted in FIGS. 4A and 4B.

As shown in FIG. 5, a resist pattern may be formed on a semiconductor substrate using the double-exposure mask set of FIGS. 4A and 4B. A first pattern region is exposed through a first exposure region 56, and a second pattern region is exposed through a second exposure region 66. The overlap region 69 between the first exposure region 56 and the second exposure region 66 is double-exposed to form a pattern. If photolithography is performed after the double-exposure, a first resist pattern 74a is formed that is exposed during the primary exposure, and a second resist pattern 74b is formed that is exposed during the secondary exposure. A connection portion between the first and second resist patterns 74a and 74b is formed by the double-exposure in the overlap region 69. The first resist pattern 74a may be arranged at a first pitch PI, and the second resist pattern 74b may be arranged at a second pitch P2 that is larger than the first pitch P1.

Figure 6A:
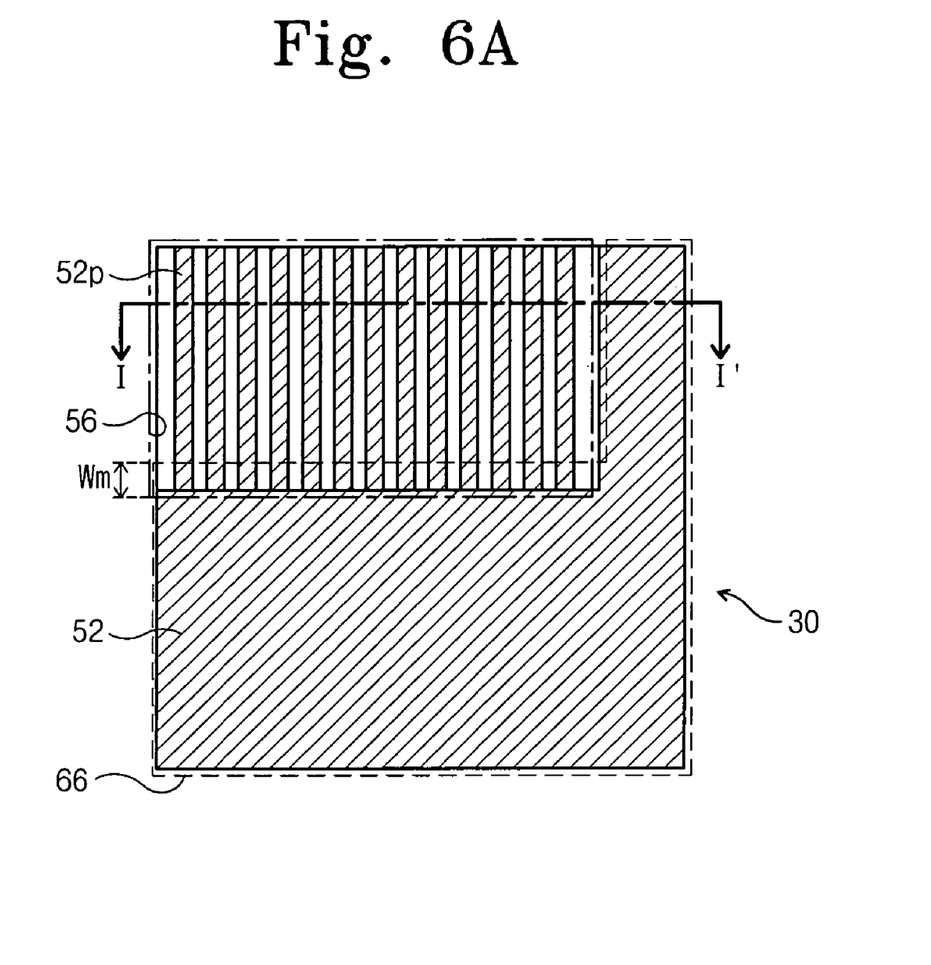
FIGS. 6A and 7A are plan views illustrating a method for fabricating a first mask of a double-exposure mask set according to certain embodiments of the present invention.
Figure 6B:
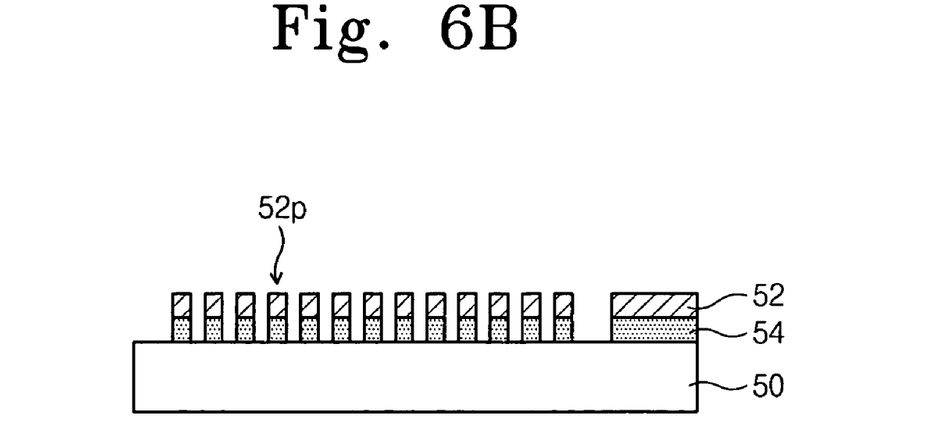
FIGS. 6B and 7B are cross-sectional views taken along line I-I' of FIGS. 6A and 7A, respectively.
Figure 7A:
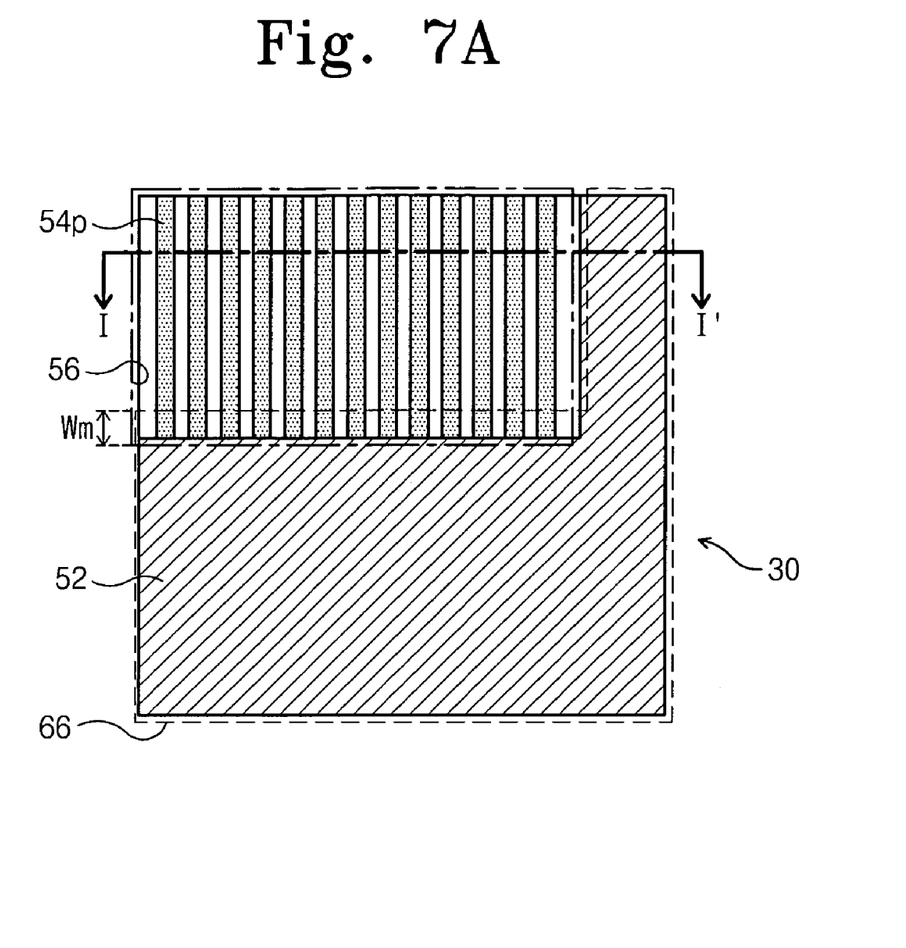
Figure 7B:
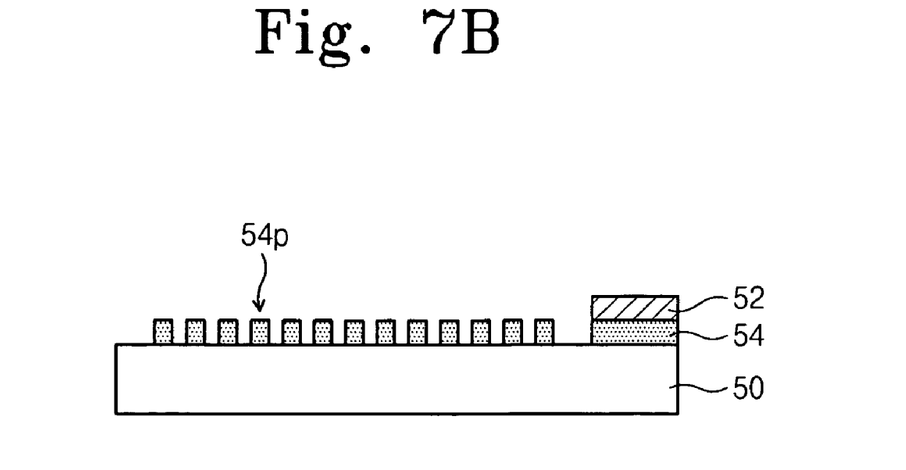

FIGS. 6A and 7A are plan views illustrating a method of fabricating a first mask layer 30 of a double-exposure mask set according to certain embodiments of the present invention. FIGS. 6B and 7B are cross-sectional views taken along line I-I' of FIGS. 6A and 7A, respectively.

With reference to FIGS. 6A and 6B, a halftone layer 54 and a shield layer 52 are provided on a substrate 50. The halftone layer 54 and the shield layer 52 are patterned to form a first exposure region 56 and a first screen region. As shown in FIGS. 6A and 6B, in the first exposure region 56 the stacked halftone layer 54 and shield layer 52 are patterned to form a shield pattern 52p. In the first screen region, the halftone layer 54 and the shield layer 52 are not patterned.

As shown in FIGS. 7A and 7B, to form the first mask layer 30, the shield layer 52 of the first exposure region 56 is removed, thereby providing a first halftone pattern 54p in the first exposure region 56. The first mask layer 30 includes a first exposure region 56 and a first screen region. The first halftone pattern 54p is provided in the first exposure region 56, and the first screen region is covered with the shield layer 52.

Figure 8A:
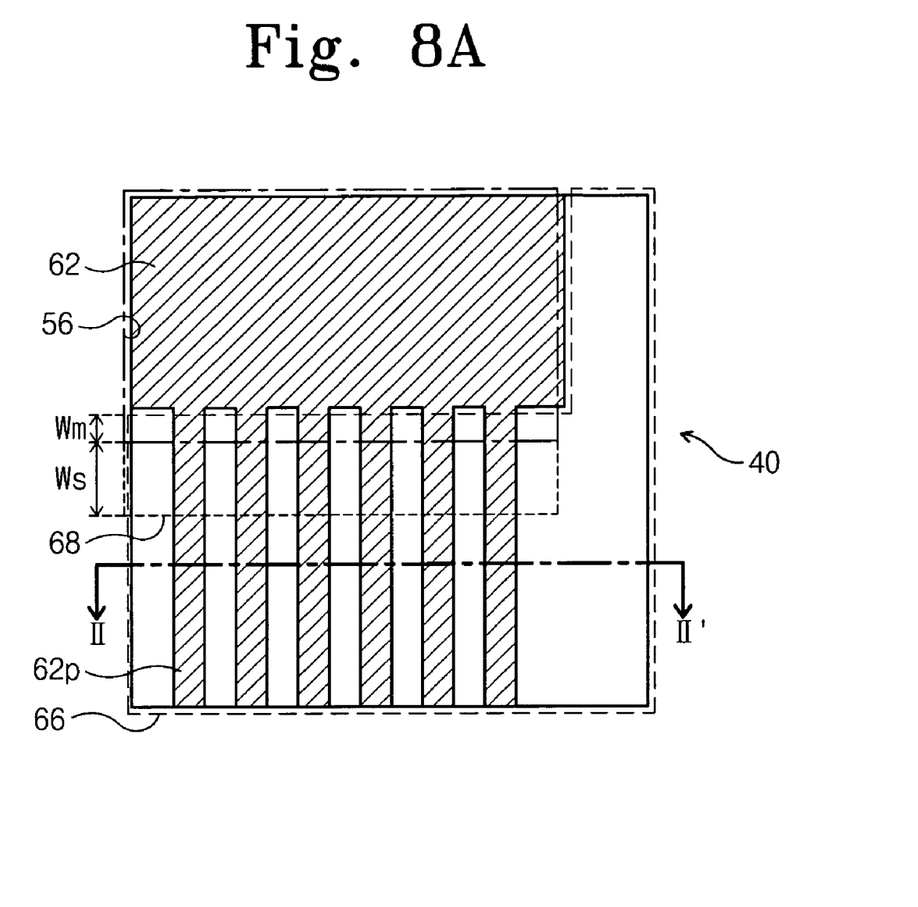
FIGS. 8A and 9A are plan views illustrating a method for fabricating a second mask of a double-exposure mask set according to certain embodiments of the present invention.
Figure 8B:
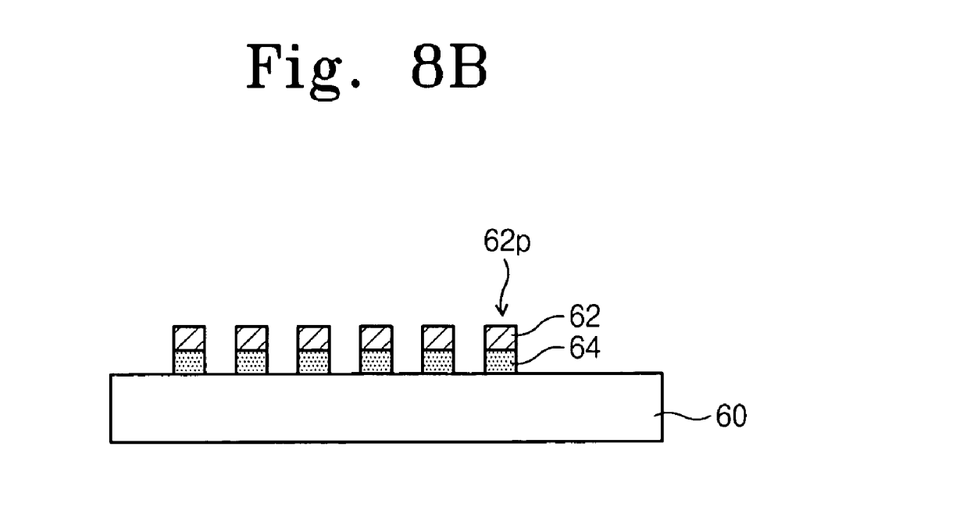
FIGS. 8B and 9B are cross-sectional views taken along line II-II' of FIGS. 8A and 9A, respectively.
Figure 9A:
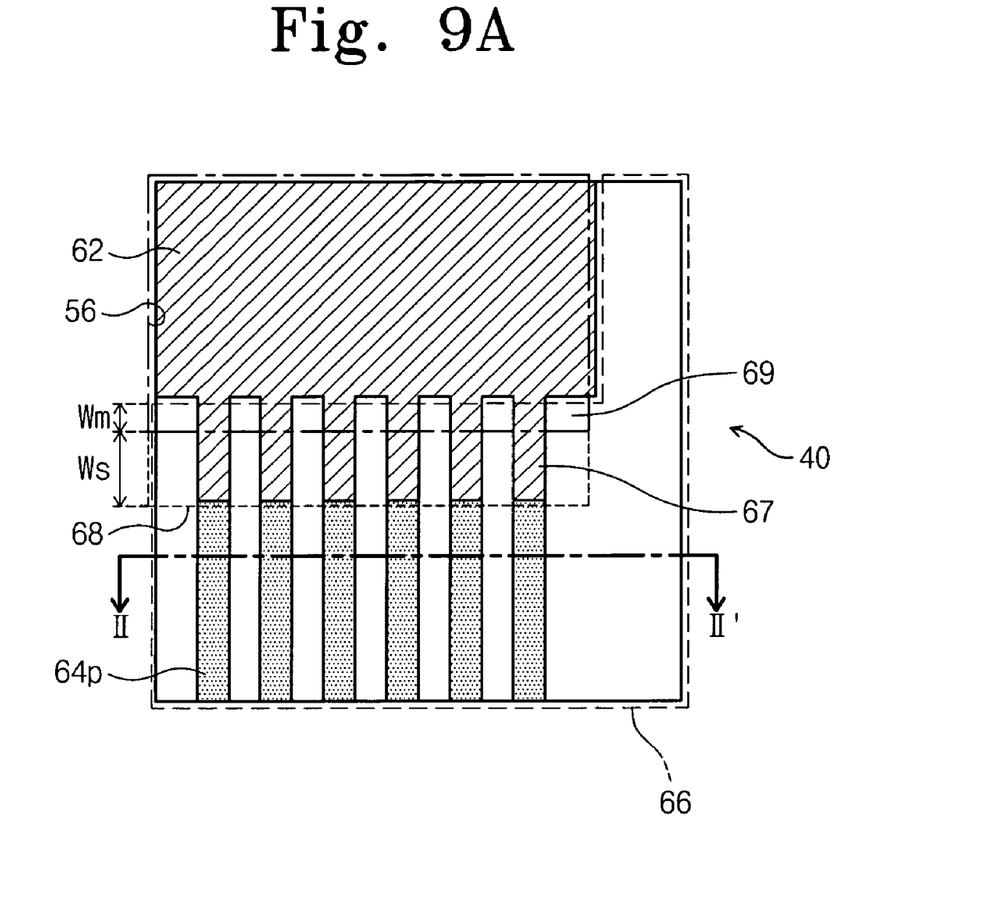
Figure 9B:
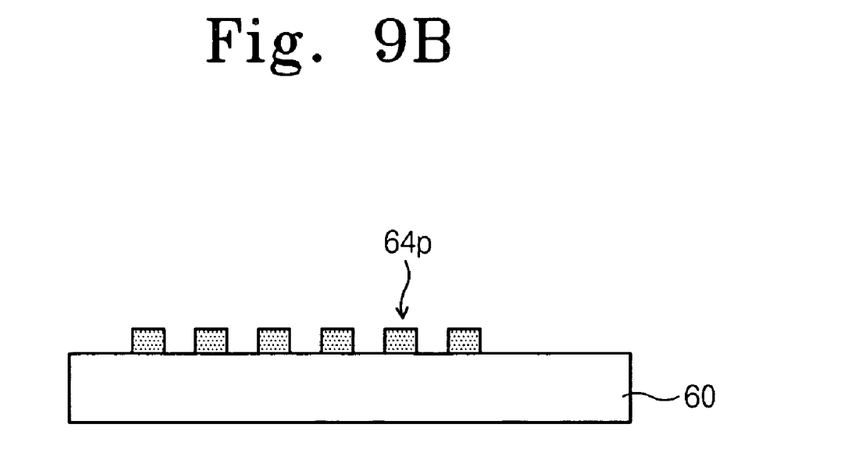

FIGS. 8A and 9A are plan views illustrating a method of fabricating the second mask layer 40 of a double-exposure mask set according to certain embodiments of the present invention. FIGS. 8B and 9B are cross-sectional views taken along line II-II' of FIGS. 8A and 9A, respectively.

As shown in FIGS. 8A and 8B, a halftone layer 64 and a shield layer 62 are provided on a substrate 60. The halftone layer 64 and the shield layer 62 are patterned to form a second exposure region 66 and a second screen region. In the second exposure region 66, the halftone layer 64 and the shield layer 62 are patterned to provide a shield pattern 62p. The second screen region is covered with the halftone layer 64 and the shield layer 62.

As shown in FIGS. 9A and 9B, to complete the second mask layer 40, part of the shield layer 62 in the second exposure region 66 is removed, thereby forming a second halftone pattern 64p. As shown in FIG. 9A, the second mask layer 40 includes a second exposure region 66 and a second screen region. The second exposure region 66 includes a second halftone pattern 64p and a binary pattern 67 that is provided in a binary region 68 that is adjacent to the second screen region. The second screen region is covered with the halftone layer 64 and the shield layer 62.

As shown in FIGS. 7A, 8A and 9A, the first and second exposure regions 56 and 66 may overlap by as much as a width Wm, thereby defining an overlap region 69 (see FIG. 9A). When such overlap occurs, the first screen region corresponds to the second exposure region 66 minus the overlap region 69. The second screen region corresponds to the first exposure region 56 minus the overlap region 69. The binary pattern 67 is provided in a binary region 68 that is larger than the overlap region 69. For example, in FIG. 9A, the width Ws may be larger than the width Wm.

Figure 10A:
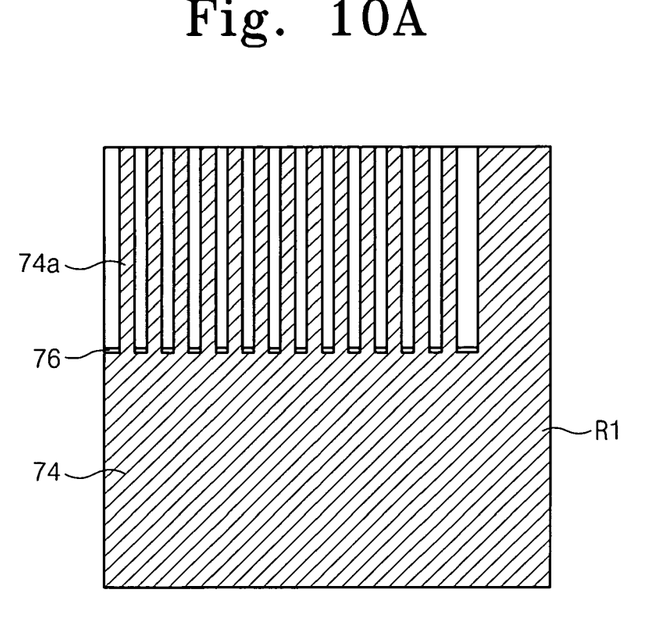
FIGS. 10A to 10C are plan views illustrating a photolithographic etching method using a mask set according to certain embodiments of the present invention.
Figure 10B:
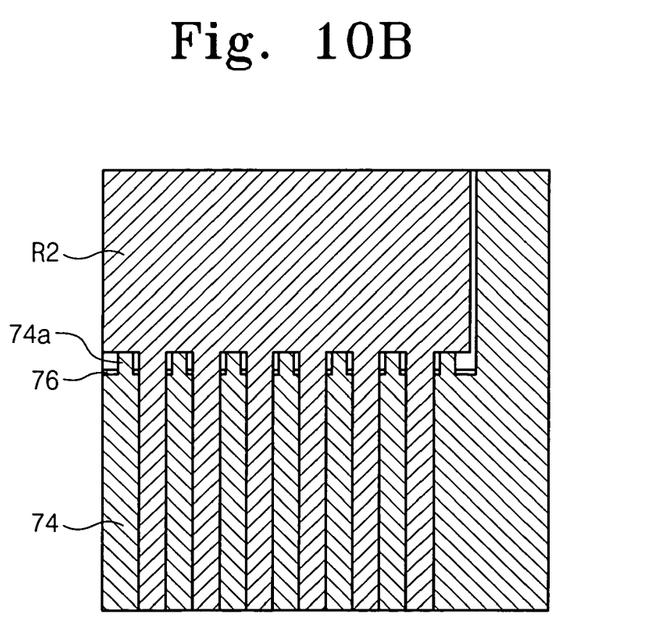
Figure 10C:
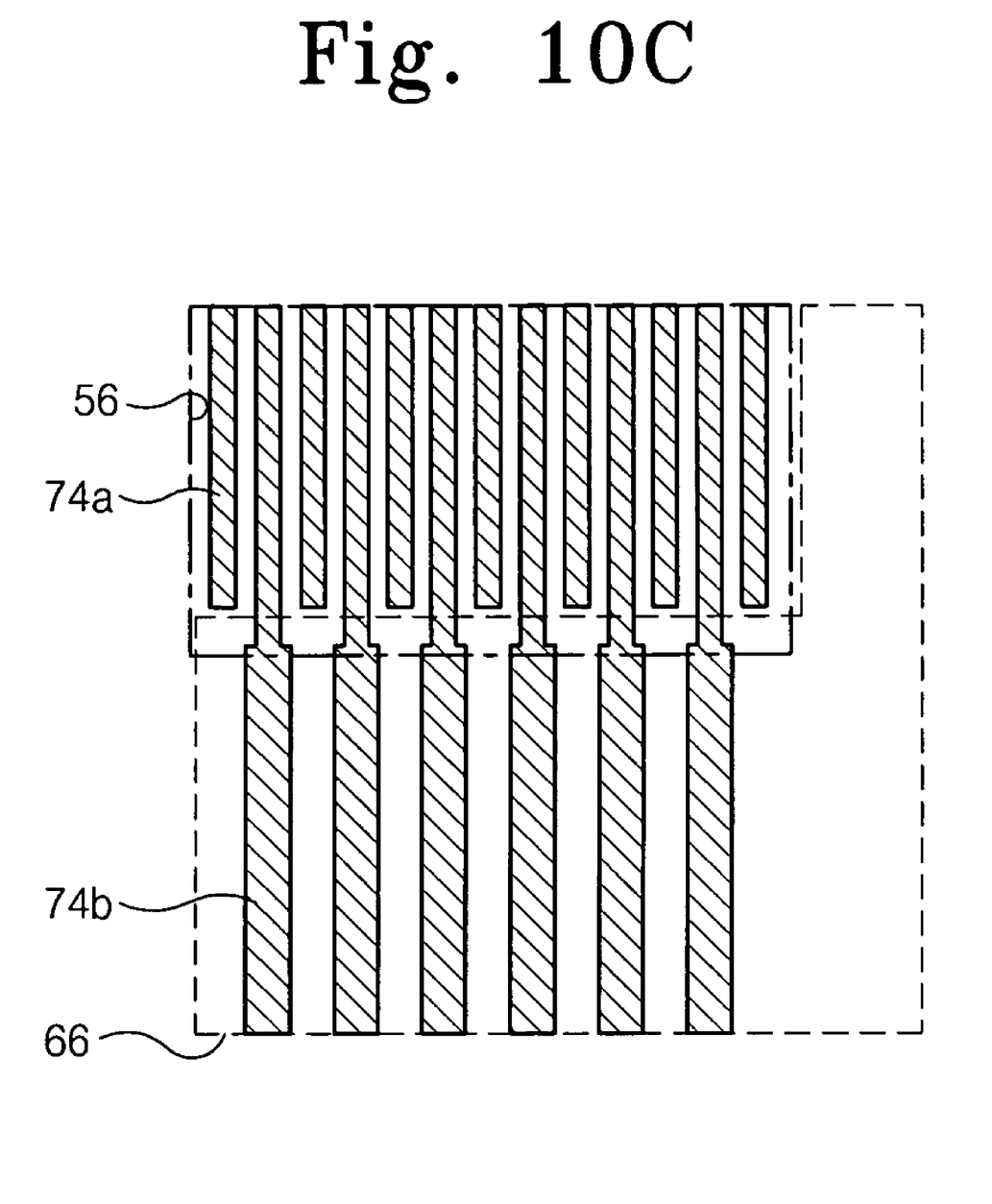

FIGS. 10A to 10C are process diagrams illustrating a photolithography etching process that is performed using a mask set according to certain embodiments of the present invention.

With reference to FIG. 10A, a photoresist layer 74 is formed on a semiconductor substrate. A primary exposure process is performed on the semiconductor substrate using the first mask layer. In FIG. 10A, the region designated R1 is the non-exposure region during the primary exposure. As a result of the primary exposure process, a first halftone pattern 74a is formed in the first exposure region. As noted above, misalignment between the halftone layer and a shield layer may occur in the first mask layer, and as such an abnormal exposure 76 of the photoresist layer may occur adjacent the boundary between the first exposure region and the first screen region.

With reference to FIG. 10B, a secondary exposure is subsequently performed using a second mask layer. In FIG. 10B, the region designated R2 is the non-exposure region during the secondary exposure. As shown in FIG. 10B, part of the first halftone pattern 74a is exposed by the second mask layer. Also, the abnormal exposure portion 76 is exposed. The second mask layer does not form an abnormal exposure portion such as the first mask layer because the boundary of the second screen is a binary mask.

With reference to FIG. 10C, the secondary exposure is performed using the second mask layer, so that a binary pattern and a second halftone pattern are transferred to a region corresponding to the second exposure region. After the primary exposure and the secondary exposure are completed, the photoresist 74 is developed to form a first photoresist pattern 74a and a second photoresist pattern 74b.

In accordance with some embodiments of the present invention, a photoresist may be developed using a double-exposure mask set after primary exposure and secondary exposure are completed, so that a photoresist pattern with a first pitch and a photoresist pattern with a second pitch are formed. During the primary exposure, a halftone mask may be used to form a pattern with a small pitch. During the secondary exposure, a halftone mask that includes a patched binary mask may be used so as to reduce or minimize undesired exposure at or adjacent to the boundary between an exposure region and a screen region.

According to further embodiments of the present invention, more than two mask layers can be used applying the same techniques discussed above.

As discussed above, the second mask layer may comprise a binary pattern and a halftone pattern. The second mask may be used after performing primary exposure using a first mask layer that includes a halftone pattern. The second mask layer may be used to partially or fully correct an abnormal exposure that may occur during the primary exposure induced by a misalignment and registration of a halftone layer and a shield layer.

Therefore, according to certain embodiments of the present invention, a process margin of an exposure process may be improved by overcoming problems such as the decrement of design rule and variation of layout.

In the drawings and specification, there have been disclosed typical embodiments of the invention and, although specific terms are employed, they are used in a generic and descriptive sense only and not for purposes of limitation, the scope of the invention being set forth in the following claims.

What is claimed is:
1. A mask set for defining a first pattern region and a second pattern region, the mask set comprising:

a first mask including a first shield region and a first exposure region in which a first halftone pattern is formed to define the first pattern region; and a second mask including a second exposure region in which a binary pattern and a second halftone pattern are formed to define the second pattern region;

wherein a part of the second exposure region overlaps a part of the first exposure region to define an overlap region, and wherein a boundary between the binary pattern and the second halftone pattern is offset from the overlap region.

2. The mask set of claim 1, wherein the first halftone pattern has a first pitch, and wherein the second halftone pattern has a second pitch that is larger than the first pitch.

3. The mask set of claim 1, wherein the binary pattern defines a portion of the second pattern region that is adjacent to the first pattern region.

4. The mask set of claim 1, wherein the binary pattern connects to the first halftone pattern.

5. The mask set of claim 1, wherein the binary pattern is provided in the portion of the second exposure region that overlaps the first exposure region and in a portion of the second pattern region that is adjacent to the portion of the second exposure region that overlaps the first exposure region.

6. A mask set for defining a pattern that includes a first pattern region having a first pitch pattern and a second pattern region having a second pitch pattern on a semiconductor device during the fabrication of the semiconductor device, the mask set comprising:

a first mask, the first mask comprising:
a first exposure region that includes a first halftone pattern that defines the first pattern region; and
a first screen region that includes a first shield layer that covers at least some of the second pattern region; and
a second mask, the second mask comprising:
a second exposure region that includes a second halftone pattern that defines the second pattern region; and
a second screen region that includes a second shield layer that covers at least some of the first pattern region,
wherein the second shield layer also extends from the second screen region to cover a portion of the second halftone pattern.

7. The mask set of claim 6, wherein the first exposure region and the second exposure region overlap to define an overlap region.

8. The mask set of claim 7, wherein the width of the overlap region is less than a predetermined width.

9. The mask set of claim 7, wherein the portion of the second halftone pattern covered by the second shield layer is more than twice the area of the overlap region.

10. The mask set of claim 7, wherein the second pitch is larger than the first pitch.

11. The mask set of claim 7, wherein the first halftone pattern defines a pattern which is repeated periodically, and wherein the second halftone pattern defines an irregular pattern.

12. A mask set for defining a cell array region and a peripheral circuit region during the fabrication of a semiconductor memory device, the mask set comprising:

a first mask that includes a first halftone pattern that defines the cell array region and a first shield layer that covers the peripheral circuit region; and a second mask that includes a second halftone pattern that defines the peripheral region and a second shield layer that covers the cell array region and a portion of the second halftone pattern.

13. The mask set of claim 12, wherein the first halftone pattern is positioned in a first exposure region and the second halftone pattern is positioned in a second exposure region, and wherein the first exposure region and the second exposure region overlap to define an overlap region.

14. The mask set of claim 13, wherein the portion of the second halftone pattern covered by the second shield layer is more than twice the area of the overlap region.

15. The mask set of claim 13, wherein a predetermined portion of the first halftone pattern does not overlap with the second halftone pattern in the overlap region.

16. The mask set of claim 13, wherein the first exposure region extends into a portion of the peripheral circuit region that is adjacent to the cell array region.

17. The mask set of claim 12, wherein the first halftone pattern defines a pattern which is repeated periodically, and wherein the second halftone pattern defines an irregular pattern.

18. A method of fabricating a mask set for defining a pattern that includes a first pattern region and a second pattern region, the method comprising:

forming a first halftone layer on a first mask substrate;
forming a first shield layer on the first halftone layer;
patterning the first halftone layer and the first shield layer to form a first mask, wherein the first mask includes a first exposure region where the first pattern region is defined and a first screen region that covers the second pattern region, and forming a second halftone layer on a second mask substrate;
forming a second shield layer on the second halftone layer;
patterning the second halftone layer and the second shield layer to form a second mask, wherein the second mask includes a second exposure region where the second pattern region is defined and a second screen region that covers the first pattern region, removing the first shield layer in the first exposure region; and removing the second shield layer in only a portion of the second exposure region so that the second shield layer extends from the second screen region into a portion of the second exposure region.

19. The method of claim 18, wherein the first exposure region and the second exposure region partially overlap to define an overlap region.

20. The method of claim 19, wherein a portion of the second exposure region that includes the second shield layer has an area that is at least twice an area of the overlap region.

21. The method of claim 18, wherein the first pattern region has a first pitch pattern and the second pattern region has a second pitch pattern that is larger than the first pitch pattern.

* * * * *